(12) United States Patent
Kishimura et al.

(10) Patent No.: US 6,521,393 B1
(45) Date of Patent: Feb. 18, 2003

(54) PATTERN FORMATION METHOD

(75) Inventors: Shinji Kishimura, Hyogo (JP); Akiko Katsuyama, Kyoto (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/515,334

(22) Filed: Feb. 29, 2000

(30) Foreign Application Priority Data

Mar. 5, 1999 (JP) .......................................... 11-058430

(51) Int. Cl.⁷ ................................................ G03F 7/30
(52) U.S. Cl. ..................... 430/326; 430/270.1; 430/910; 430/945; 522/31
(58) Field of Search ................................ 430/325, 326, 430/270.1, 905, 925, 945, 967, 910; 522/31

(56) References Cited

U.S. PATENT DOCUMENTS

| | | | |
|---|---|---|---|
| 5,738,975 A | * 4/1998 | Nakano et al. | 430/280.1 |
| 5,863,699 A | * 1/1999 | Asakawa et al. | 430/270.1 |
| 5,866,304 A | * 2/1999 | Nakano et al. | 430/325 |
| 6,042,991 A | * 3/2000 | Aoai et al. | 430/285.1 |

FOREIGN PATENT DOCUMENTS

| | | |
|---|---|---|
| JP | 10-123703 | 5/1998 |
| JP | 10-213904 | 8/1998 |
| JP | 10-333326 | 12/1998 |
| JP | 2000-37274 | 2/2000 |

OTHER PUBLICATIONS

Partial English Translation, "Lecture for Electron Information Architecture 12 Device—Process", pp. 113, lines 17–32, Oct. 20, 1998.
Partial English Translation, "Submicron Lithography Total Technique", pp. 53, left column, lines 1–8, Mar. 20, 1985.

* cited by examiner

*Primary Examiner*—John S. Chu
(74) *Attorney, Agent, or Firm*—Nixon Peabody LLP; Donald R. Studebaker

(57) ABSTRACT

A resist film is formed by applying, on a semiconductor substrate, a chemically amplified resist including an acid generator of an onium salt having a halogen atom both in the cation and the anion thereof. The resist film is irradiated with a $F_2$ laser beam with a wavelength of a 157 nm band or an $Ar_2$ laser beam with a wavelength of a 126 nm band for pattern exposure, and the resist film is developed after the pattern exposure, thereby forming a resist pattern.

8 Claims, 3 Drawing Sheets

PATTERN FORMATION METHOD

BACKGROUND OF THE INVENTION

The present invention relates to a pattern formation method, and more particularly, it relates to a lithography technique to form a resist pattern by using exposing light of a wavelength of a 1 nm through 180 nm band for forming a semiconductor device or a semiconductor integrated circuit on a semiconductor substrate.

In accordance with improvement in a semiconductor device or a semiconductor integrated circuit with higher integration and more refinement, there are increasing demands for further development of lithography techniques.

As exposing light used in forming a resist pattern through pattern exposure conducted on a resist film formed on a semiconductor substrate, KrF excimer laser or ArF excimer laser has already been put to practical use or is now being examined for practical use.

Also, a chemically amplified resist excellent in resolution and sensitivity is now considered to be used as a resist material.

In order to realize further refinement of a semiconductor device or a semiconductor integrated circuit, however, it is necessary to use, as the exposing light, a laser beam with a wavelength shorter than that of the ArF excimer laser, such as a $Xe_2$ laser beam (with a wavelength of a 172 nm band), a $F_2$ excimer laser (with a wavelength of a 157 nm band), a $Kr_2$ laser beam (with a wavelength of a 146 nm band), an ArKr laser beam (with a wavelength of a 134 nm band), an $Ar_2$ laser beam (with a wavelength of a 126 nm band) and a soft X-ray beam (with a wavelength of a 13, 11 or 5 nm band).

Therefore, the present inventors have formed a resist pattern from a resist film of a known chemically amplified resist through pattern exposure using a $F_2$ laser beam. Now, a method of forming a resist pattern from a known resist material will be described with reference to FIGS. 3(a) through 3(d).

First, a resist material having the following composition is prepared:

| Base polymer: | |
|---|---|
| poly((2-methyl-2-adamantylmethacrylate) (30 mol%) (methylmethacrylate) (20 mol%) - (methacrylic acid) (10 mol %) mol%) | 2 g |
| Acid generator: triphenylsulfonium triflate | 0.4 g |
| Solvent: diglyme | 20 g |

Then, as is shown in FIG. 3(a), the resist material having the aforementioned composition is applied by spin coating on a semiconductor substrate 1 and heated, thereby forming a resist film 2 with a thickness of 0.3 μm.

Next, as is shown in FIG. 3(b), the resist film 2 is irradiated with a $F_2$ laser beam 4 through a mask 3 for the pattern exposure. In this manner, an acid is generated from the acid generator in an exposed portion 2a of the resist film 2 while no acid is generated in an unexposed portion 2b of the resist film 2.

Then, as is shown in FIG. 3(c), the semiconductor substrate 1 is heated with a hot plate, for example, at 100° C. for 60 seconds.

Thereafter, the resist film 2 is developed with an alkaline developer, such as a 2.38 wt % tetramethylammonium hydroxide developer. Thus, the resist pattern is formed.

The resultant resist pattern 5 has, however, a defective pattern shape as is shown in FIG. 3(d).

The resist pattern 5 similarly has a defective pattern shape not only when the $F_2$ laser beam is used as the exposing light but also when light of a wavelength of a 1 nm through 180 nm band is used.

SUMMARY OF THE INVENTION

In consideration of the aforementioned conventional problem, an object of the invention is forming a resist pattern in a good pattern shape through pattern exposure using light of a wavelength of a 1 nm through 180 nm band as exposing light.

The present inventors have concluded that the resist pattern has a defective pattern shape because the resist film has a high absorbing property against light of a wavelength of a 1 nm through 180 nm band, and examined various means for decreasing the absorbing property against light of a wavelength of a 1 nm through 180 nm band. As a result, it has been found that the absorbing property of the resist film against light of a wavelength of a 1 nm through 180 nm band can be decreased when both a cation and an anion of an onium salt used as an acid generator has a halogen atom.

Then, the inventors have examined the reason why the absorbing property against light of a wavelength of a 1 nm through 180 nm band can be decreased when both a cation and an anion of an onium salt used as an acid generator has a halogen atom. As a result, it has been found that a halogen atom has a property to shift the light absorption wavelength band inherent in the resist material.

Specifically, the pattern formation method of this invention comprises the steps of forming a resist film by applying, on a substrate, a chemically amplified resist including an acid generator of an onium salt having a halogen atom in both a cation and an anion thereof; and forming a resist pattern through pattern exposure by irradiating the resist film with exposing light of a wavelength of a 1 nm through 180 nm band and developing the resist film after the pattern exposure.

In the pattern formation method of this invention, since both the cation and the anion of the onium salt has a halogen atom, the peak of the light absorption wavelength of the resist film is shifted. Therefore, the absorbing property against light of a wavelength of a 1 nm through 180 nm band can be decreased. Accordingly, the transparency against the exposing light of a wavelength of a 1 nm through 180 nm band can be increased. As a result, through the pattern exposure by using the exposing light of a wavelength of a 1 nm through 180 nm band, a resist pattern can be formed in a good pattern shape.

In the pattern formation method, the halogen atom is preferably a fluorine atom.

In the pattern formation method, the cation of the onium salt preferably includes a phenyl group having a halogen atom.

In the pattern formation method, the anion of the onium salt is preferably a sulfonic acid ion having a halogen atom.

In the pattern formation method, the exposing light is preferably a $F_2$ laser beam or an $Ar_2$ laser beam.

DETAILED DESCRIPTION OF THE INVENTION

In the pattern formation method of this invention, a chemically amplified resist material including an acid generator of an onium salt having a halogen atom in its cation and anion is used. In an acid generator used in an embodiment described below, both a cation and an anion of an onium salt have a fluorine atom as the halogen atom. Now, the composition of the resist material is as follows:

| Base polymer: | |
| --- | --- |
| poly((2-methyl-2-adamantylmethacrylate) (30 mol%) - (methylmethacrylate) (20 mol %) - (methacrylic acid) (10 mol %) | 2 g |
| Onium salt: tri(2,4,6-trifluorophenyl)sulfonium triflate | 0.4 g |
| Solvent: diglyme | 20 g |

Figure 1A:
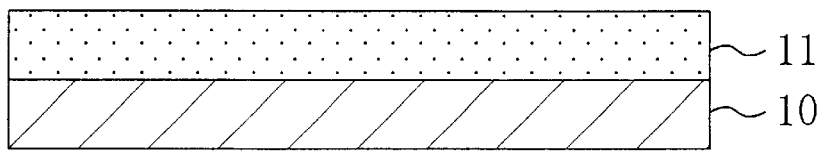
FIGS. 1(a) through 1(d) are sectional views for showing procedures in a pattern formation method according to an embodiment of the invention.

First, as is shown in FIG. 1(a), the chemically amplified resist material having the aforementioned composition is applied by spin coating on a semiconductor substrate 10 and heated, thereby forming a resist film 11 with a thickness of 0.3 μm.

Figure 1B:
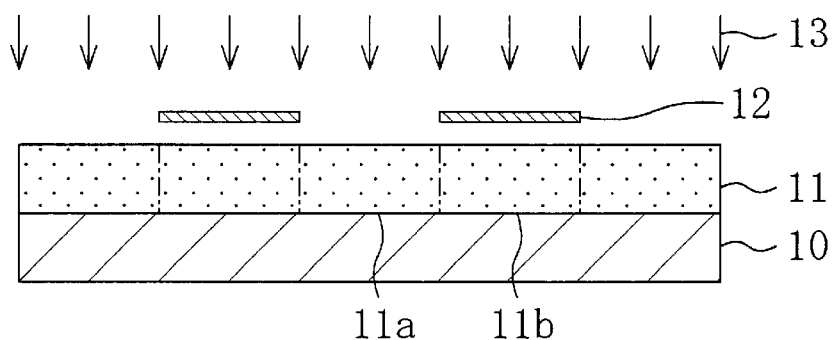

Then, as is shown in FIG. 1(b), the resist film 11 is irradiated with a $F_2$ laser beam 13 with a wavelength of a 157 nm band through a mask 12 for pattern exposure. In this manner, an acid is generated from the onium salt in an exposed portion 11a of the resist film 11 while no acid is generated in an unexposed portion 11b of the resist film 11.

Figure 1C:
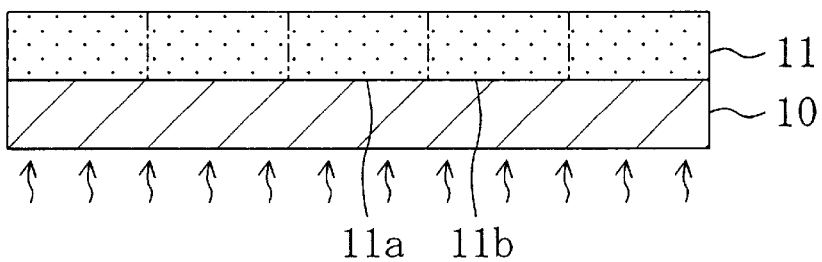

Thereafter, as is shown in FIG. 1(c), the semiconductor substrate 10 together with the resist film 11 are heated with a hot plate at 100° C. for 60 seconds. Although the base polymer is alkali-refractory, it decomposes when heated in the presence of an acid, and hence, the exposed portion 11a of the resist film 11 becomes soluble in an alkaline aqueous solution.

Figure 1D:
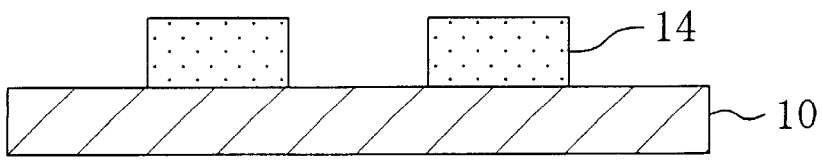

Next, the resist film 11 is developed with a 2.38 wt % tetramethylammonium hydroxide developer. Since the exposed portion 11a of the resist film 11 is dissolved in the developer, the unexposed portion 11b of the resist film 11 is formed into a resist pattern 14 as shown in FIG. 1(d).

In this embodiment, both the cation and the anion of the onium salt have a fluorine atom, and hence, the peak of the light absorption wavelength of the resist film 11 is shifted toward a longer wavelength, and the absorbing property against light of a wavelength in the vicinity of 157 nm is decreased. Accordingly, the resist film 11 attains higher transparency against the exposing light of a wavelength of a 1 nm through 180 nm band, and therefore, the exposing light can sufficiently reach the bottom of the resist film 11. As a result, the resultant resist pattern is in a good pattern shape with a line width of 0.09 μm.

Figure 2:
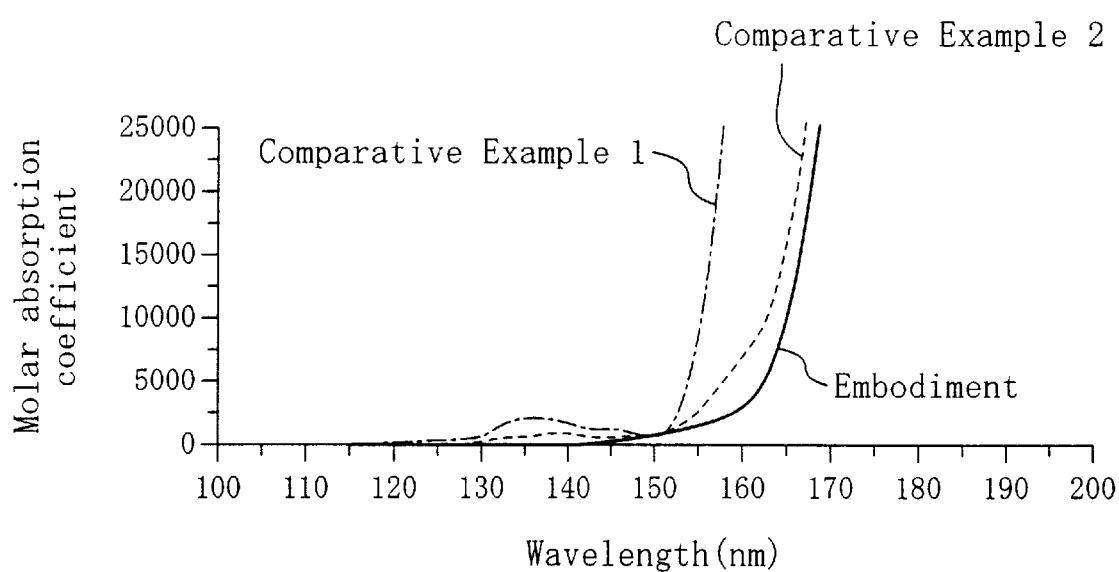
FIG. 2 is a graph for exemplarily verifying that the peak of a light absorption wavelength band is shifted toward a longer wavelength when both a cation and an anion of an onium salt have a fluorine atom.
Figure 3A:
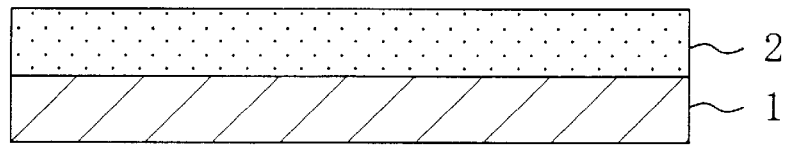
FIGS. 3(a) through 3(d) are sectional views for showing procedures in a pattern formation method as a premise of the present invention.
Figure 3B:
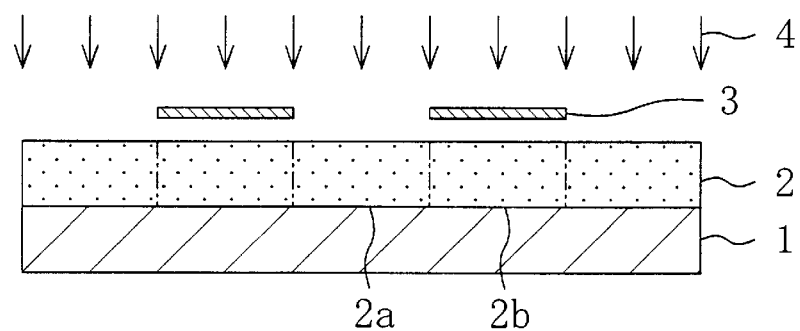
Figure 3C:
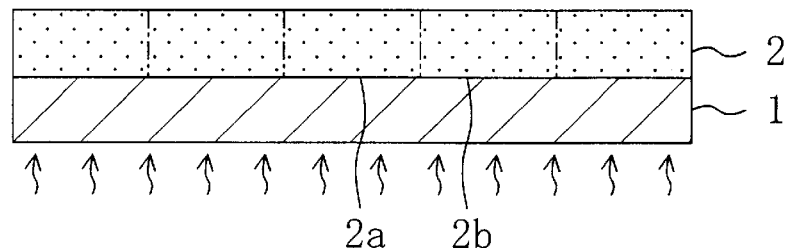
Figure 3D:

FIG. 2 is a graph for showing exemplified verification conducted for evaluating this embodiment. In the graph of FIG. 2, the absorption wavelength of triphenylsulfonium tosylate, that is, an onium salt having a fluorine atom in neither its cation nor its anion is shown as Comparative Example 1; the absorption wavelength of triphenylsulfonium triflate, that is, an onium salt having a fluorine atom in its anion but not in its cation is shown as Comparative Example 2; and the absorption wavelength of tri(2,4,6-trifluorophenyl)sulfonium triflate, that is, an onium salt having a fluorine atom in both of its cation and anion is shown as Embodiment.

As is obvious from FIG. 2, when both the cation and the anion have a fluorine atom, the peak of the light absorption wavelength is shifted toward a longer wavelength and the absorbing property against light of a wavelength in the vicinity of 157 nm is decreased.

In this embodiment, a phenyl group, that is, the cation of the onium salt has a fluorine atom and a sulfonic acid ion, that is, the anion of the onium salt has a fluorine atom. However, the cation of an onium salt is not limited to a phenyl group, and the anion of an onium salt is not limited to a sulfonic acid ion.

Examples of the onium salt having a halogen atom in both of its cation and anion are as follows, which do not limit the invention:

Tri(2,4,6-trichlorophenyl)sulfonium triflate: an example having a chlorine atom in its cation and a fluorine atom in its anion;

Tri(4-fluorophenyl)sulfonium 2,6-difluorotosylate: an example having a fluorine atom in its cation and a fluorine atom in its anion;

Dimethylfluorosulfonium triflate: an example having a fluorine atom in its cation and a fluorine atom in its anion.

Furthermore, although the $F_2$ laser beam with a wavelength of a 157 nm band is used as the exposing light for the pattern exposure in the embodiment, a $Xe_2$ laser beam (with a wavelength of a 172 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band) can be used instead.

What is claimed is:

1. A pattern formation method comprising the steps of:
    forming a resist film by applying, on a substrate, a chemically amplified resist including an acid generator of an onium salt having a cation and an anion; and
    forming a resist pattern through pattern exposure by irradiating said resist film with exposing light selected from a group of laser beams composed of $Xe_2$ laser beam, $F_2$ laser beam, $Kr_2$ laser beam, ArKr laser beam and $Ar_2$ laser beam, and developing said resist film after the pattern exposure,
    wherein a cation atom of a part of the cation comprises at least one cyclic compound including a halogen atom and the cation atom is not included in the cyclic compound,
    and wherein the anion includes a halogen atom.

2. The pattern formation method of claim 1, wherein said halogen atom is a fluorine atom.

3. The pattern formation method of claim 1, wherein said anion of said onium salt is a sulfonic acid ion having a halogen atom.

4. The pattern formation method of claim 1, wherein the cation atom of the onium salt is sulfur or bromine.

5. The pattern formation method of claim 1, wherein the cyclic compound is not directly connected to another cyclic compound.

6. The pattern formation method of claim 1, wherein the cyclic compound is directly connected to the cation atom.

7. The pattern formation method of claim 1, wherein the cation comprises three cyclic compounds.

8. The pattern formation method of claim 7, wherein the three cyclic compounds have the same chemical formula.

* * * * *